(12) United States Patent
Park

(10) Patent No.: US 9,257,176 B1
(45) Date of Patent: Feb. 9, 2016

(54) 3D VARIABLE RESISTANCE MEMORY DEVICE AND METHOD OF MANUFACTURING THE SAME

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/877,690

(22) Filed: Oct. 7, 2015

Related U.S. Application Data

(62) Division of application No. 13/975,639, filed on Aug. 26, 2013, now Pat. No. 9,184,216.

(30) Foreign Application Priority Data

Apr. 25, 2013 (KR) .................. 10-2013-0046090

(51) Int. Cl.
*G11C 11/00* (2006.01)
*G11C 13/00* (2006.01)

(52) U.S. Cl.
CPC .......... *G11C 13/004* (2013.01); *G11C 13/0069* (2013.01)

(58) Field of Classification Search
CPC ....................................... G11C 11/00
USPC ............. 365/46, 94, 100, 129, 148, 158, 163; 257/2–5, 9, 310, E21.35; 438/95, 96, 438/135, 166, 240, 365, 482, 486, 597, 785
See application file for complete search history.

(56) References Cited

U.S. PATENT DOCUMENTS

| | | | | |
|---|---|---|---|---|
| 2008/0007993 A1* | 1/2008 | Saitoh | .................... | G11C 11/16 365/158 |
| 2009/0161408 A1* | 6/2009 | Tanigami | ........... | G11C 13/0007 365/148 |
| 2012/0161094 A1* | 6/2012 | Huo | ...................... | H01L 27/249 257/4 |
| 2013/0056820 A1* | 3/2013 | Jeong | .................. | H01L 27/0688 257/324 |
| 2014/0054538 A1* | 2/2014 | Park | ...................... | H01L 27/249 257/5 |
| 2014/0070302 A1* | 3/2014 | Yoo | ...................... | H01L 27/1157 257/324 |

* cited by examiner

*Primary Examiner* — Harry W Bryne
(74) *Attorney, Agent, or Firm* — IP & T Group LLP

(57) ABSTRACT

A variable resistance memory device includes a plurality of cell gate electrodes extending in a first direction, wherein the plurality of cell gate electrodes are stacked in a second direction that is substantially perpendicular to the first direction. A gate insulating layer surrounds each cell gate electrode of the plurality of cell gate electrodes and a cell drain region is formed on two sides of the each cell gate electrode of the plurality of cell gate electrodes. A channel layer extends in the second direction along the stack of the plurality of cell gate electrodes, and a variable resistance layer contacting the channel layer.

6 Claims, 12 Drawing Sheets

3D VARIABLE RESISTANCE MEMORY DEVICE AND METHOD OF MANUFACTURING THE SAME

CROSS-REFERENCES TO RELATED APPLICATION

This application is a division of U.S. patent application Ser. No. 13/975,639 filed on Aug. 26, 2013, which claims priority under 35 U.S.C. §119(a) to Korean application number 10-2013-0046090, filed on Apr. 25, 2013, in the Korean Intellectual Property Office. The disclosure of each of the foregoing applications is incorporated herein by reference in its entirety.

BACKGROUND

Currently, resistive memory devices using a resistance material has been suggested, and the resistive memory devices may include phase-change random access memories (PCRAMs), resistance RAMs (ReRAMs), or magentoresistive RAMs (MRAMs) has been suggested.

The resistive memory devices may include a switching device and a resistance device, and may store data "0" or "1" according to a state of the resistance device.

Even in the resistive memory devices, the first priority is to improve integration density and to integrate memory cells in a narrow area as many as possible.

Currently, the variable resistance memory device is also configured in a 3D structure, but there is a high need for a method of stably stacking a plurality of memory cells with smaller critical dimension (CD).

SUMMARY

An exemplary variable resistance memory device. The variable resistance memory device may include: a semiconductor substrate; a common source region formed on the semiconductor layer; a channel layer formed substantially perpendicular to a surface of the semiconductor substrate, the channel layer being selectively connected to the common source region; a plurality of cell gate electrodes formed along a side of the channel layer; a gate insulating layer formed around each cell gate electrode, of the plurality of cell gate electrodes, a cell drain region located between the each cell gate electrode of the plurality of cell gate electrodes; a variable resistance layer formed along another side of the channel layer; and a bit line electrically connected to the channel layer and the variable resistance layer.

An exemplary method of manufacturing a variable resistance memory device include: forming a common source line on a semiconductor substrate; forming selection switches on the common source region; forming, over the selection switches, an insulating structure on the semiconductor substrate by alternately stacking a plurality of first interlayer insulating layers, having a first etch selectivity, and a plurality of second interlayer insulating layers, having a second etch selectivity that is different than the first etch selectivity; forming through-holes in the insulating structure to expose the string selection switches; forming space portions by removing portions of the plurality of first interlayer insulating layers exposed through the through-holes; forming a cell drain region in each of the space portions; forming, in each through-hole, a channel layer along surfaces defining each through-hole; selectively removing the plurality of second insulating layers to form a plurality of openings; forming a gate insulating layer in each opening of the plurality of openings; forming a cell gate electrode in each opening, of the plurality of openings, so that each cell gate electrode is surrounded by a gate insulating layer; forming a variable resistance layer on a surface of the channel layer; forming an insulating layer in the through-holes; and forming a bit line to be electrically connected to the channel layer and the variable resistance layer.

An exemplary variable resistance memory device may include: a plurality of cell gate electrodes extending in a first direction, wherein the plurality of cell gate electrodes are stacked in a second direction that is substantially perpendicular to the first direction; a gate insulating layer surrounding each cell gate electrode of the plurality of cell gate electrodes; a cell drain region formed on two sides of the each cell gate electrode of the plurality of cell gate electrodes; a channel layer extending in the second direction along the stack of the plurality of cell gate electrodes; and a variable resistance layer contacting the channel layer.

A method of operating an exemplary variable resistance memory device, including a plurality of memory cells having a plurality of cell gate electrodes extending in a first direction, wherein the plurality of cell gate electrodes are stacked in a second direction that is substantially perpendicular to the first direction; a gate insulating layer surrounding each cell gate electrode of the plurality of cell gate electrodes; a cell drain region formed on two sides of the each cell gate electrode of the plurality of cell gate electrodes; a channel layer extending in the second direction along the stack of the plurality of cell gate electrodes; and a variable resistance layer contacting the channel layer, wherein the variable resistance memory device is in contact with a selection switch, may include: selecting a memory cell, of the plurality of memory cells, via the selection switch; passing a current from a bit line through a variable resistor of the selected memory cell to perform an operation on the selected memory cell; and passing the current through a portion of the channel layer associated with a non-selected memory cell.

These and other features, aspects, and exemplary implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
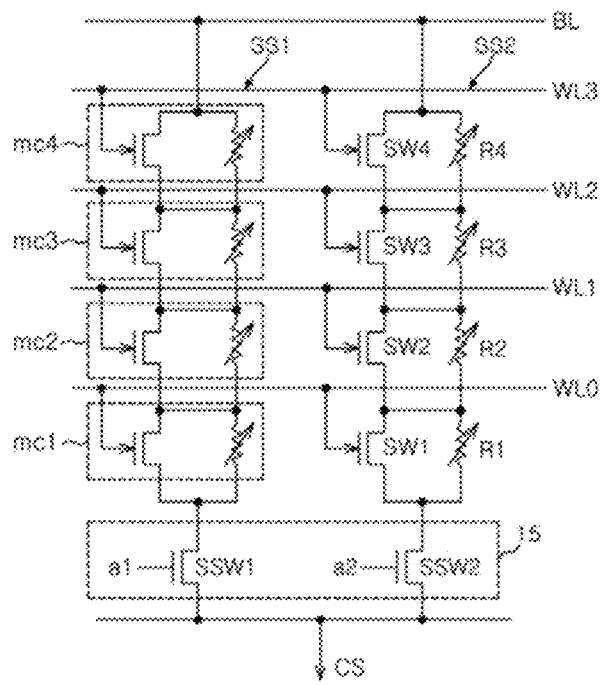
FIG. 1 is a circuit diagram illustrating an exemplary variable resistance memory device.

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Throughout the disclosure, reference numerals correspond directly to the like numbered parts in the various figures and implementations of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Referring to FIG. 1, an exemplary variable resistance memory device 10 includes a plurality of memory cells mc1, mc2, mc3, and mc4, connected in series.

The plurality of memory cells mc1, mc2, mc3, and mc4, which are connected in series, may be connected between a bit line BL and a common source line CS. That is, the plurality of memory cells mc1, mc2, mc3, and mc4 may be implemented by sequentially stacking the memory cells mc1, mc2, mc3, and mc4 on a semiconductor substrate (not shown). In the exemplary implementation, a set of the stacked memory cells mc1 to mc4, connected in series, may be referred to as a column string SS1 and SS2. A plurality of column strings SS1 and SS2 may be connected to one bit line BL.

Each of the plurality of memory cells mc1 to mc4 may include a switching device SW1 to SW4 and a variable resistor R1 to R4. The switching device SW1 to SW4 and the variable resistor R1 to R4 may be connected in parallel to each other.

A MOS transistor, a diode, a bipolar transistor, or an impact ionization MOS (IMOS) transistor may be used as the switching devices SW1 to SW4. The variable resistors R1 to R4 may include various materials, such as a Pr1-xCaxMnO3 (PCMO) layer, if the variable resistor is a ReRAM, a chalcogenide layer, if the variable resistor is a PCRAM, a magnetic layer, if the variable resistor is a MRAM, a magnetization reversal device layer, if the variable resistor is a spin-transfer torque magnetoresistive RAM (STTMRAM), or a polymer layer, if the variable resistor is a polymer RAM (PoRAM).

A column switch array 15 may be connected between the column strings SS1 and SS2 and the common source line CS. The column switch array 15 may include a plurality of string selection switches SSW1 and SSW2. Each of the string selection switches SSW1 and SSW2 may be connected to a corresponding column strings SS1 or SS2. Each of the string selection switches SSW1 or SSW2 selectively connects a corresponding column string SS1 or SS2 to the common source line CS in response to a corresponding selection signal a1 or a2.

Figure 2:
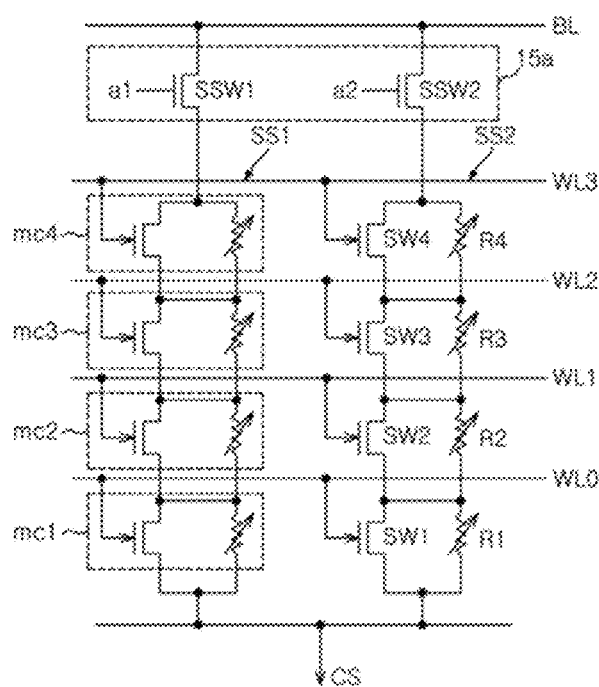
FIG. 2 is a circuit diagram illustrating an exemplary variable resistance.

FIG. 2 illustrates an alternative arrangement of the column switch array 15, the column strings SS1 and SS2, and the bit line BL.

Hereinafter, driving the exemplary variable resistance memory device will be described. As an example, a process of reading and writing data from and to a third memory cell mc3 of a first column string SS1 will be described.

Figure 3:
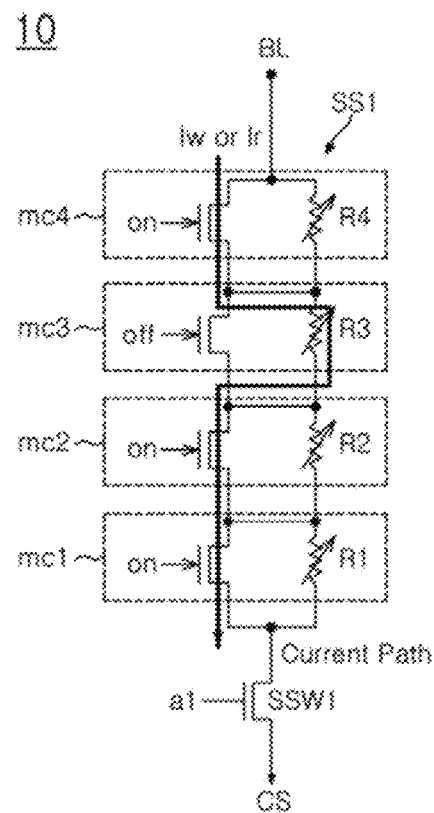
FIG. 3 is a view illustrating a driving method of an variable resistance memory device.

Referring to FIG. 3, a high voltage is applied to a gate a1 of a first string switch SSW1 to select the first column string SS1.

To write data to the third memory cell mc3, the switching device SW3 of the third memory cell mc3 is turned off, and the first switching device SW1 of the first memory cell mc1, the second switching device SW2 of second memory cell mc2, and the fourth switching device SW4 of the fourth memory cells mc4, are turned on.

Accordingly, the fourth switching device SW4 in the fourth memory cell mc4, the second switching device SW2 in the second memory cell mc2, and the first switching device SW1 in the first memory cell mc1, are turned on to form a current path is formed in the fourth switching device SW4, the second switching device SW2, and the first switching device SW1. The third switching device SW3 in the third memory cell mc3 is turned off, and a current path is formed in a third variable resistor R3.

Therefore, a write current Iw, provided from the bit line BL, flows to the common source line CS through the fourth switching device SW4, the third variable resistor R3, and the second switching device SW2, and first switching device SW1. Therefore, data may be written to the third memory cell mc3.

A read operation of the third memory cell mc3 may be carried out in substantially the same manner as described above for the write operation, except that a read current Ir (instead of a write current Iw) may be provided from the bit line BL. The read current Ir reaches the common source line CS connected to a ground through a corresponding current path. The data written in the variable resistor R3 may be sensed by measuring using read circuit (not shown) a current value reaching the common source line CS. At this time, the read current Ir has a level that does not affect a crystallization state of the variable resistor R3, and may have a lower value than that of the write current Iw.

Hereinafter, a exemplary method of manufacturing an exemplary variable resistance memory device will be described with reference to FIGS. 4 to 10.

Figure 4:
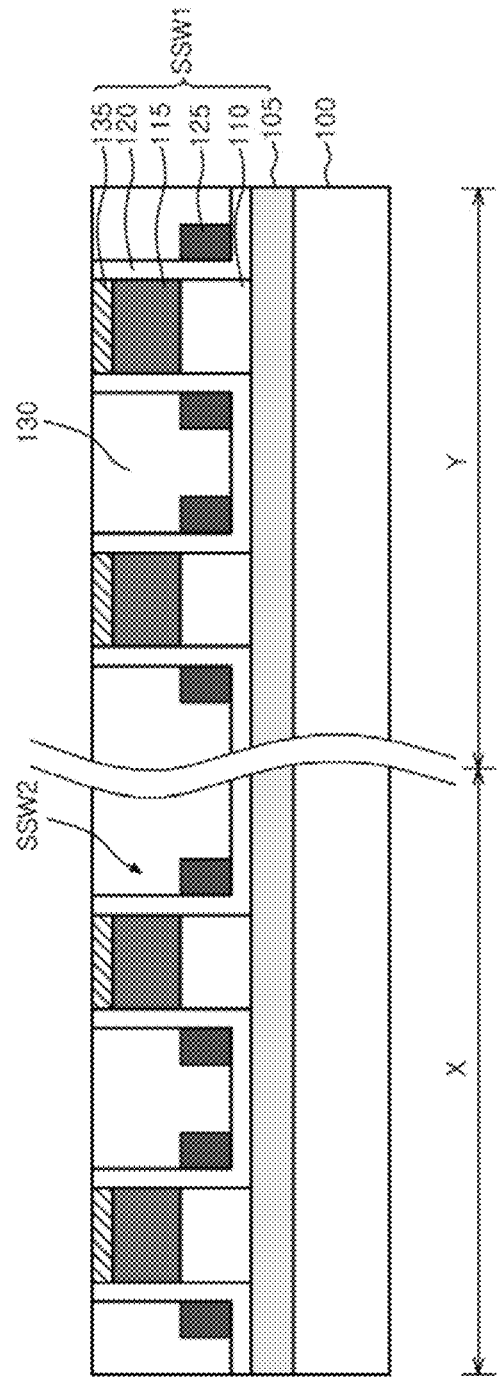
FIGS. 4 to 10 are cross-sectional views sequentially illustrating an exemplary method of manufacturing a variable resistance memory device.

Referring to FIG. 4, a common source region 105 is formed on a semiconductor substrate 100. In FIG. 4, an "X" region indicates a portion of the variable resistance memory device taken in a direction parallel to a bit line to be formed later, and a "Y" region indicates a portion of the variable resistance memory device taken in a direction perpendicular to the bit line. The common source region 105 may be configured of, for example, an impurity region or a conductive layer. A conductivity type of the common source region 105 may be determined according to a conductivity type of the string selection switches SSW1 and SSW2. For example, if the string selection switches SSW1 and SSW2 are an MOS transistor, then the common source region 105 may be an N-type impurity region or a polysilicon layer doped with an N-type impurity.

A conductive layer having a certain thickness may be formed on the common source region 105, and then patterned to form a plurality of pillars 110 that will form channels of the string selection switches SSW1 and SSW2. The pillars 110 may include semiconductor layers, such as polysilicon layers. A drain region 115 may be formed into an upper portion of each of the pillars 110 using an impurity having the same conductivity type as the impurity of the common source region 105.

A gate insulating layer 120 may be formed on the semiconductor substrate 100, on which the pillars 110 are formed. A gate 125 may be formed to surround each of the pillars 110. The gate insulating layer 120 may be formed by oxidizing the semiconductor substrate 100, including the pillars 110, or by depositing an oxide layer on the semiconductor substrate 100, including the pillars 110. The gate 125 may be formed to a height (or a thickness) corresponding to the channel formation region (a region between the drain region and the common source region). Therefore, the string selection switches SSW1 and SSW2, having vertical structures, are completed.

An insulating layer 130 may be formed to cover the semiconductor substrate 100, on which the string selection switches SSW1 and SSW2 are formed. The insulating layer 130 may have a thickness sufficient to bury the string selection switches SSW1 and SSW2. The insulating layer 130 may be planarized to expose the drain region 115. An ohmic layer 135 may be formed in the exposed drain region 115 via a conventional process. The ohmic layer 135 may be, for example, a silicide.

Figure 5:
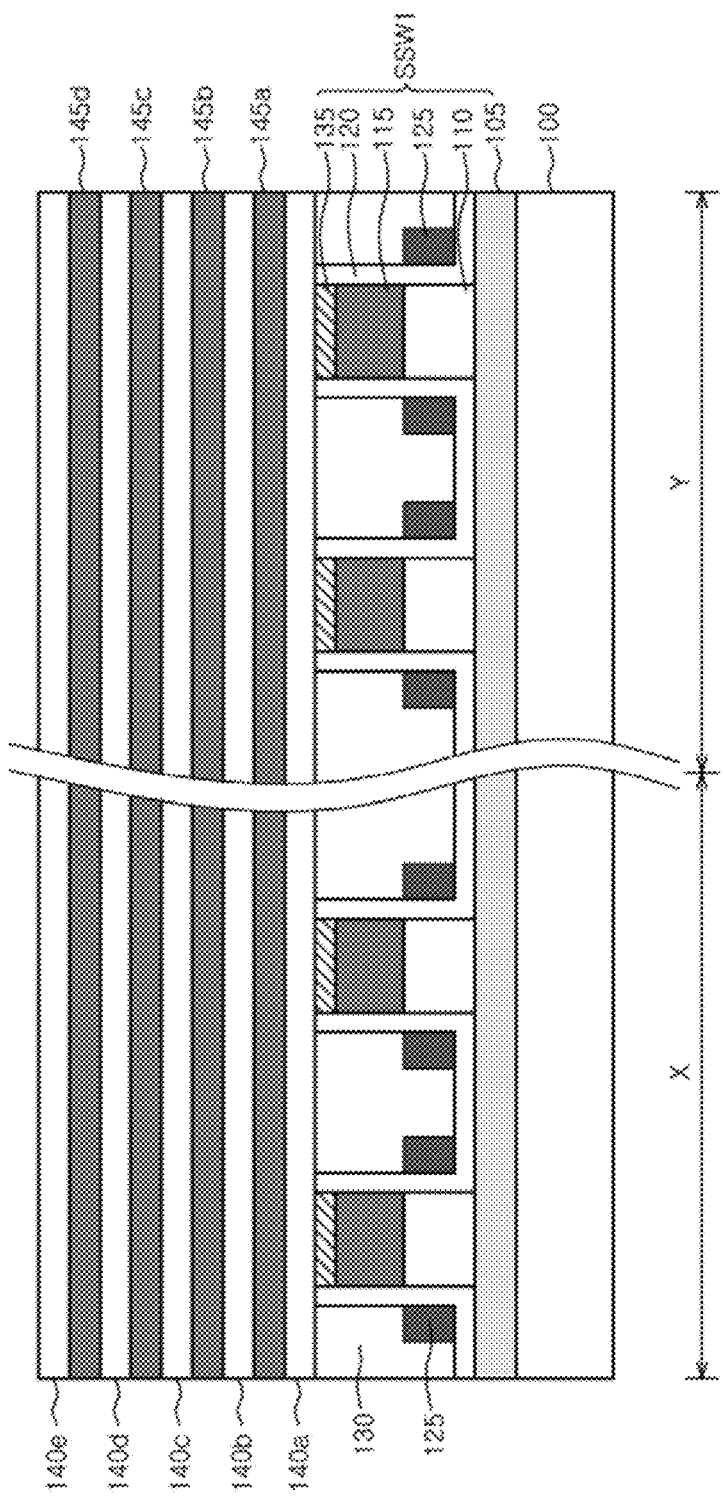

Referring to FIG. 5, first interlayer insulating layers 140*a*, 140*b*, 140*c*, 140*d*, and 140*e* and second interlayer insulating layers 145*a*, 145*b*, 145*c*, and 145*d* are alternately formed on the insulating layer 130 to form an insulating structure. For example, first interlayer insulating layer 140*e* may be located in the uppermost layer of the insulating structure. The first interlayer insulating layers 140*a*, 140*b*, 140*c*, 140*d*, and 140*e* may have an etch selectivity that is different than an etch selectivity of the second interlayer insulating layers 145*a*, 145*b*, 145*c*, 145*d*, and 145*e*.

Figure 6:
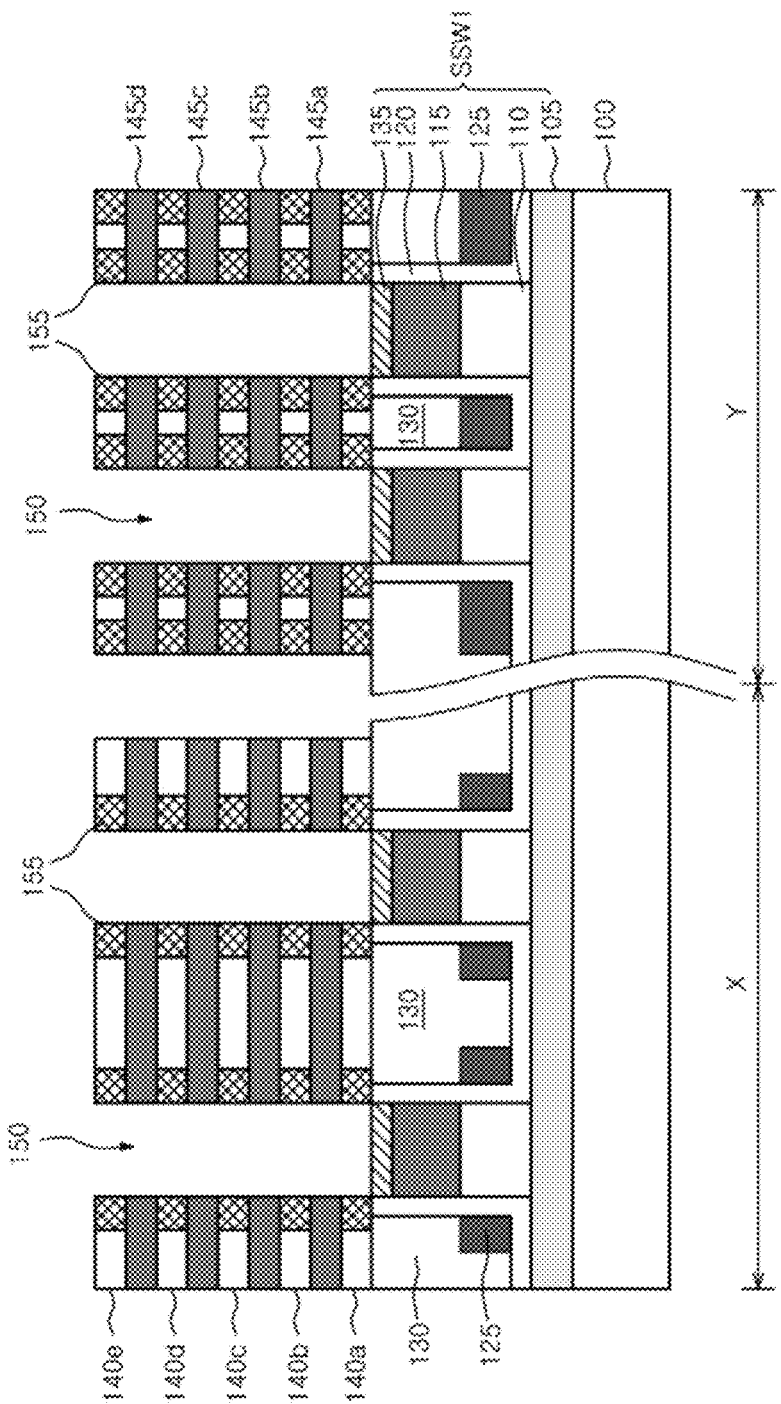

As illustrated in FIG. 6, a certain portion of the insulating structure is etched to form a through-hole 150 exposing the ohmic layer 135. Certain portions of the first interlayer insulating layers 140*a*, 140*b*, 140*c*, 140*d*, and 140*e*, which are exposed through the through-hole 150, may be are removed by, for example, a wet etch method. Therefore, the etched first interlayer insulating layers 140*a*, 140*b*, 140*c*, 140*d*, and 140*e* are narrower than the second interlayer insulating layers 145*a*, 145*b*, 145*c*, and 145*d*.

Drain regions 155 of the switching devices SW1, SW2, SW3, and SW4 are formed in spaces from which the first interlayer insulating layers 140*a*, 140*b*, 140*c*, 140*d*, and 140*e* are removed. Therefore, the drain regions of the switching devices are exposed through a sidewall of the through-hole 150.

The drain regions 155 may include, for example, a semiconductor layer, such as a silicon (Si) layer, a silicon germanium (SiGe) layer, a gallium arsenide (GaAs) layer, or a doped polysilicon layer, or a metal layer, such as tungsten (W), copper (Cu), titanium nitride (TIN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), or tantalum oxynitride (TaON).

Figure 7:
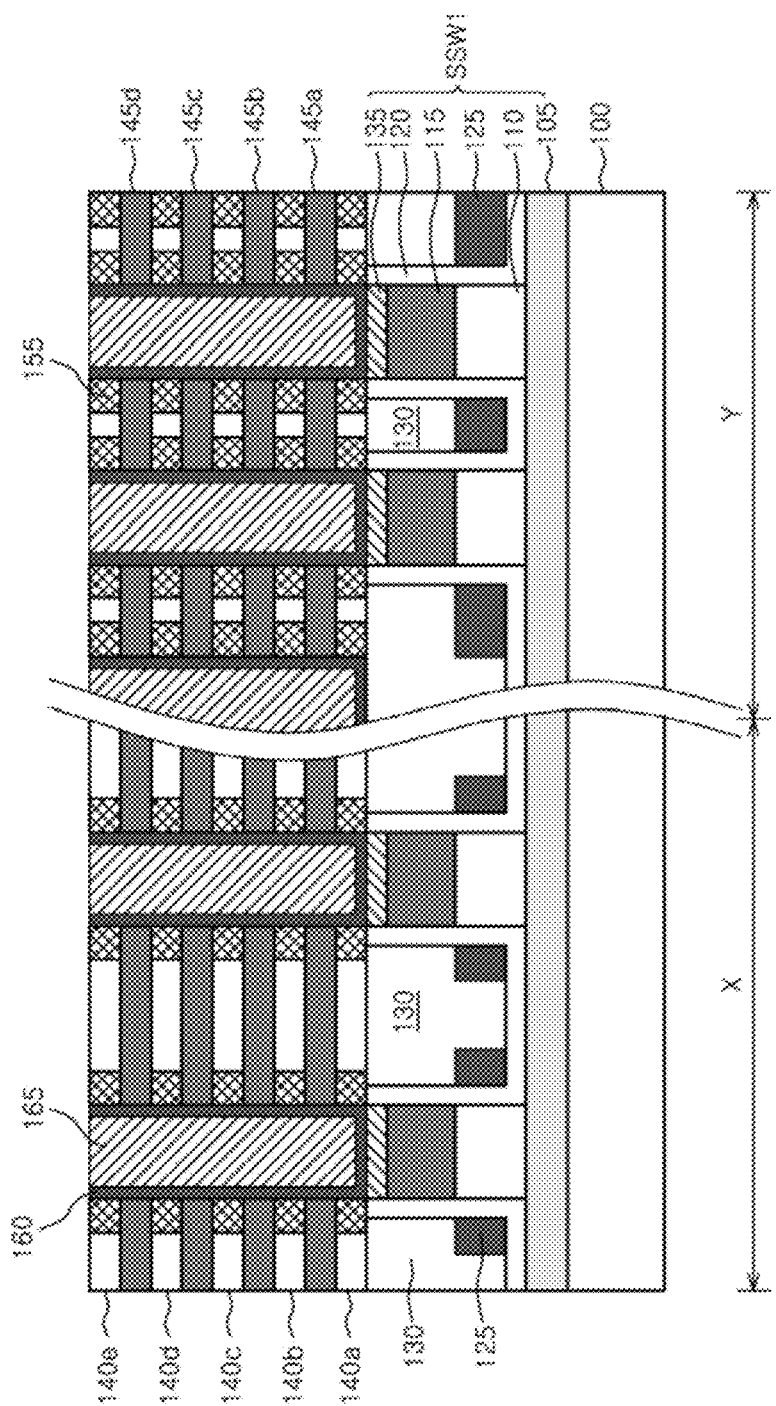

Referring to FIG. 7, a channel layer 160 is formed along a surface defining the through-hole 150. The channel layer 160 may include a conductive semiconductor layer, such as an impurity doped semiconductor layer. The channel layer 160 may have a conductivity type that is opposite to the conductivity type of the drain regions 155. A first buried insulating layer 165 is formed in the through-hole 150, over the channel layer 160. At this time, the first buried insulating layer 165 may be provided to prevent the channel layer 160 from being lost when the first and second separation holes are formed.

Figure 8:
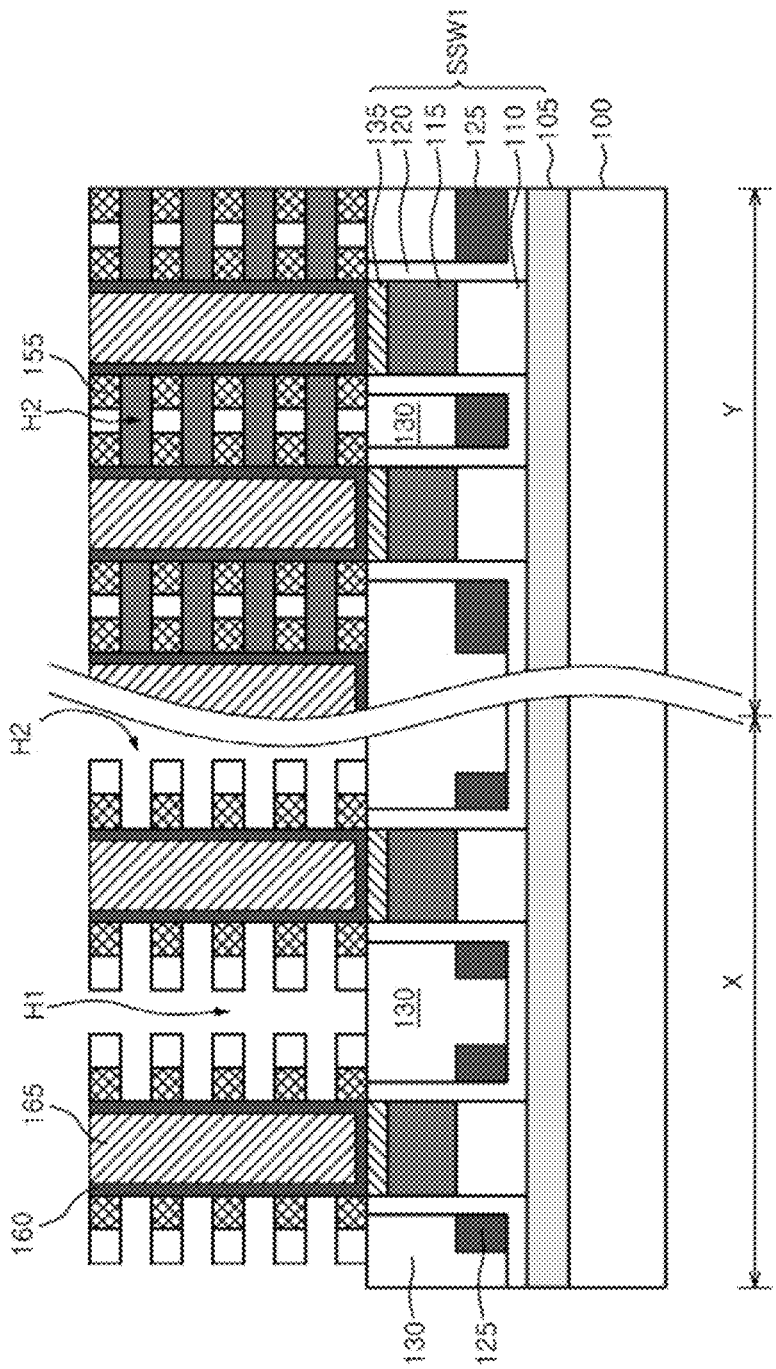

Referring to FIG. 8, a first separation hole H1 for node separation is formed in a space between through-holes 150 to separate adjacent nodes. The first separation hole H1 may be formed in the insulating structure between the string selection switches SSW1 and SSW2. The second interlayer insulating layers 145*a*, 145*b*, 145*c*, and 145*d*, which are exposed through the first separation hole H1, are removed to form second separation holes H2. Since the first interlayer insulating layers 140*a*, 140*b*, 140*c*, 140*d*, and 140*e* have an etch selectivity that is different than an etch selectivity of the second interlayer insulating layers 145*a*, 145*b*, 145*c*, and 145*d*, only the second interlayer insulating layers 145*a*, 145*b*, 145*c*, and 145*d* may be selectively removed. Therefore, the first separation holes H1 are substantially perpendicular to a surface of the semiconductor substrate 100, and the second separation holes H2 are substantially parallel to the surface of the semiconductor substrate 100.

Figure 9:
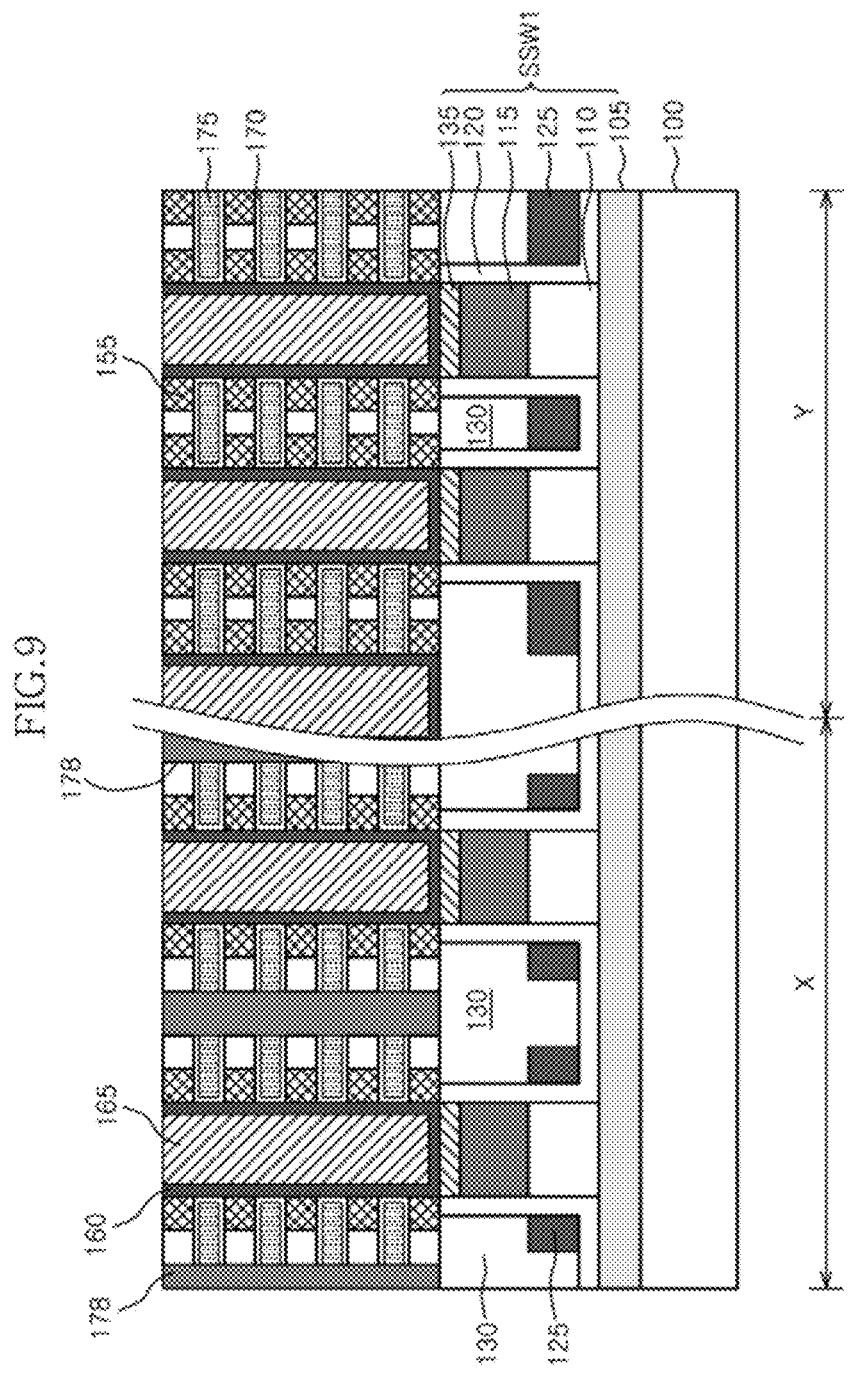

Referring to FIG. 9, a gate insulating layer 170 is formed on a surface defining each of the second separation holes H2. A gate electrode 175 is formed within each of the second separation holes H2. The gate insulating layer 170 may include, for example, silicon oxide or silicon nitride, or an oxide or a nitride of a metal, such as Ta, Ti, barium titanate (BaTi), barium zirconium (BaZr), zirconium (Zr), hafnium (Hf), lanthanum (La), aluminum (Al), or zirconium silicide (ZrSi). The gate electrode 175 may include a semiconductor layer, such as, for example, a Si layer, a SiGe layer, or an impurity doped GaAs layer, or a metal-containing layer, such as, for example, W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, Tisi, TaSi, TiW, TiON, TiAlON, WON, or TaON. Next, a second buried insulating layer 178 may be formed the first separation hole H1. The second buried insulating layer 178 may include a layer having an etch selectivity that is different than an etch selectivity of the first buried insulating layer 165.

Figure 10:
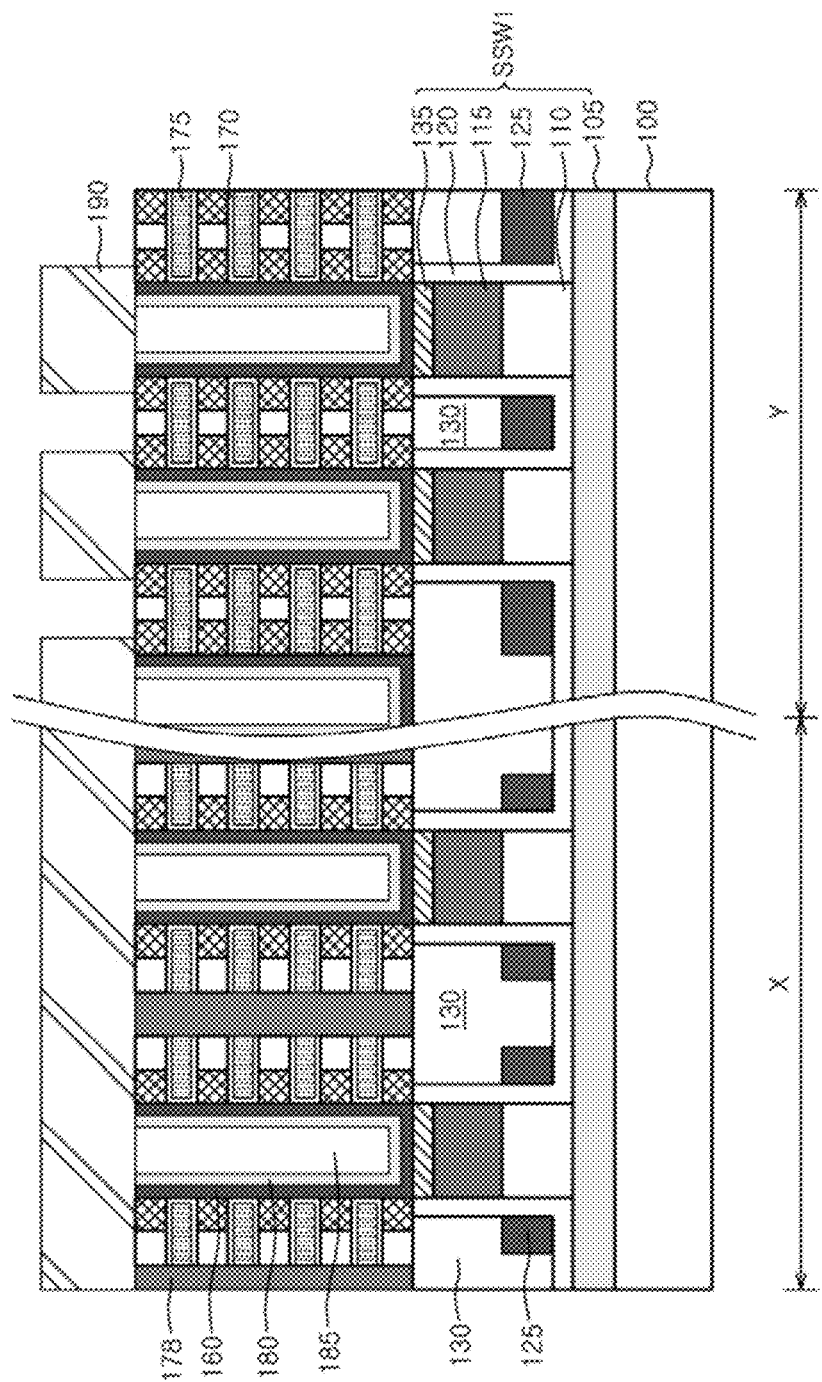

Referring to FIG. 10, the first buried insulating layer 165 buried in the through-hole 150 may be selectively removed to expose the channel layer 160. A variable resistance layer 180 is deposited on an exposed surface of the channel layer 180. The variable resistance layer 180 may include various materials, such as a Pr1-xCaxMnO3 (PCMO) layer, if the variable resistor is a ReRAM, a chalcogenide layer, if the variable resistor is a PCRAM, a magnetic layer, if the variable resistor is a MRAM, a magnetization reversal device layer, if the variable resistor is a spin-transfer torque magnetoresistive RAM (STTMRAM), or a polymer layer, if the variable resistor is a polymer RAM (PoRAM). At this time, current characteristic of the device may be controlled according to control of a thickness of the variable resistance layer 180.

A third buried insulating layer 185 may be formed within the through-hole 150, over the variable resistance layer 180. Next, a bit line 190 is formed to be in contact with the channel layer 160 and the variable resistance layer 180 and therefore, the variable resistance memory device having a stacked structure is completed.

Figure 11:
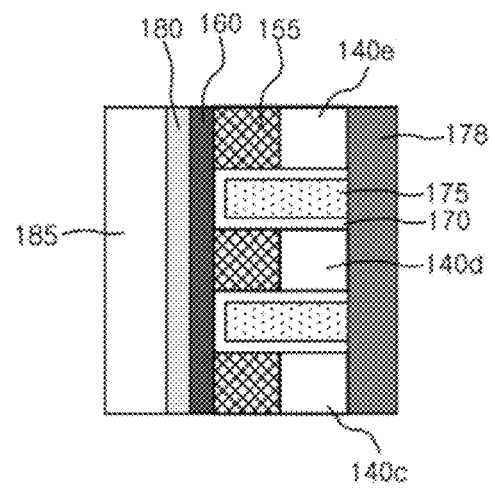
FIG. 11 is an enlarged view illustrating an exemplary switching device of a variable resistance memory device.

As illustrated in FIG. 11, in the resistance memory cell, the drain regions 155 are located adjacent to the gate electrodes 175, and the channel layer 160 and the variable resistance layer 180 are located adjacent to the drain regions. Therefore, when current is provided from the bit line 190, current selectively flows along the channel layer 160 or the variable resistance layer 180 according to an on/off condition of the switching devices SW1, SW2, SW3, and SW4.

Thus, effective channel lengths (see EC1 of FIG. 11) of the switching devices SW1, SW2, SW3, and SW4 in the exemplary implementation may be substantially increased as compared with an effective channel length (see EC2 of FIG. 11) of a conventional 3D switching device. Therefore, switching characteristics of the switching devices SW1, SW2, SW3, and SW4 may be improved without increasing a size of the switching devices SW1, SW2, SW3, and SW4.

Figure 12:
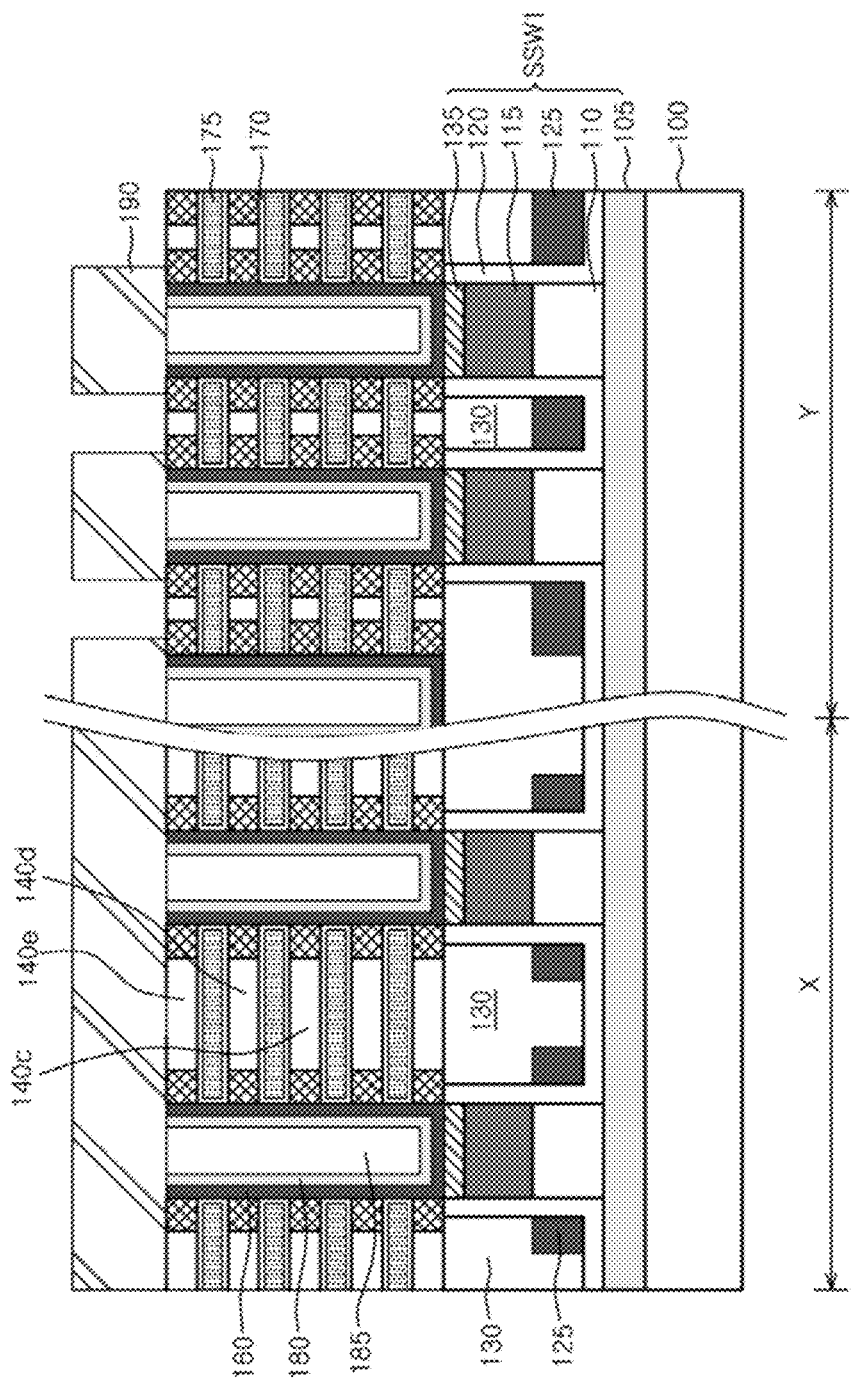
FIGS. 12 and 13 are cross-sectional views illustrating exemplary variable resistance memory devices.

FIG. 12 shown an alternative exemplary implementation that lacks the first separation holes H1 (as shown in FIG. 8). In this exemplary implementation, the same voltage may be provided to gate electrodes 175 located in the same layer. This structure may be formed by selectively removing second interlayer insulating layers 145a, 145b, 145c, and 145d without the forming of the first separation hole H1.

Figure 13:
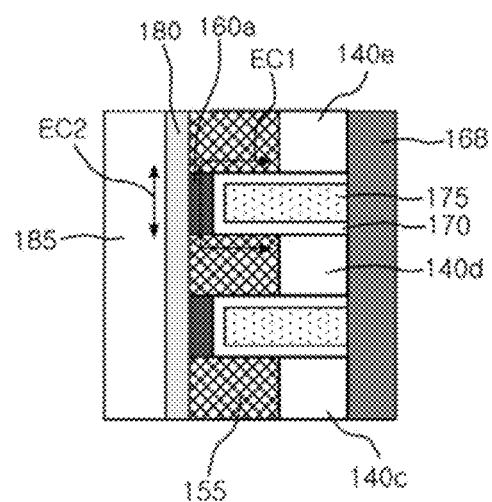

As illustrated in FIG. 13, a channel layer 160a may be formed on only a portion of a sidewall that defines a through-hole (see 150 of FIG. 6) that faces each of the gate electrodes 175. That is, since drain regions 155 are located below and on gate electrodes 175, the channel layer 160a may not affect the operation of the device even when the channel layer 160a is located in a overlapping region of the gate electrode 175 and the through-hole.

The above exemplary implementations are illustrative and not limitative. Various alternatives and equivalents are possible. The invention is not limited by the exemplary implementations described herein. Nor is the invention limited to any specific type of semiconductor device. Other additions, subtractions, or modifications are obvious in view of the present disclosure and are intended to fall within the scope of the appended claims.

What is claimed is:

1. A method of operating a variable resistance memory device, including a plurality of memory cells having a plurality of cell gate electrodes extending in a first direction, wherein the plurality of cell gate electrodes are stacked in a second direction that is substantially perpendicular to the first direction; a gate insulating layer surrounding each cell gate electrode of the plurality of cell gate electrodes; a cell drain region formed on two sides of the each cell gate electrode of the plurality of cell gate electrodes; a channel layer extending in the second direction along the stack of the plurality of cell gate electrodes; and a variable resistance layer contacting the channel layer, wherein the variable resistance memory device is in contact with a selection switch, the method comprising:

selecting a memory cell, of the plurality of memory cells, via the selection switch;

passing a current from a bit line through a variable resistor of the selected memory cell to perform an operation on the selected memory cell; and passing the current through a portion of the channel layer associated with a non-selected memory cell.

2. The variable resistance memory device of claim 1, wherein when an effective channel of the cell switch transistor includes a first overlapping portion between each of the cell gate electrodes and a corresponding channel layer, and a second overlapping portion between each of the cell gate electrodes and the cell drain regions.

3. The method of claim 1, wherein the channel layers extend in a second direction substantially perpendicular to the first direction.

4. The method of claim 1, wherein the operation is a read operation or a write operation.

5. The method of claim 4, further comprising:

sensing data written during a write operation by measuring a current value reaching a common source line associated with the bit line.

6. The method of claim 1, wherein a current to perform a read operation has a level that does not affect a crystallization state of the variable resistor.

* * * * *